(12) United States Patent
Yasuda et al.

(10) Patent No.: US 8,559,216 B2
(45) Date of Patent: Oct. 15, 2013

(54) NONVOLATILE SEMICONDUCTOR MEMORY DEVICE

(75) Inventors: Naoki Yasuda, Yokohama (JP); Daisuke Matsushita, Hiratsuka (JP); Koichi Muraoka, Sagamihara (JP)

(73) Assignee: Kabushiki Kaisha Toshbia, Tokyo (JP)

( * ) Notice: Subject to any disclaimer, the term of this patent is extended or adjusted under 35 U.S.C. 154(b) by 0 days.

(21) Appl. No.: 13/560,557

(22) Filed: Jul. 27, 2012

(65) Prior Publication Data

US 2012/0319077 A1 Dec. 20, 2012

Related U.S. Application Data

(63) Continuation of application No. PCT/JP2010/051141, filed on Jan. 28, 2010.

(51) Int. Cl.
*G11C 11/00* (2006.01)

(52) U.S. Cl.
USPC ...... 365/158; 365/171; 365/149; 365/185.05; 257/296; 257/306; 257/763; 257/5; 257/288; 438/197; 438/253; 438/106; 438/153

(58) Field of Classification Search
USPC ......... 257/4, 5, 296, 306, 763, 288, 297, 331, 257/357, 374, 379, E47.001; 365/158, 171, 365/149, 185.05; 438/197, 253, 106, 153
See application file for complete search history.

(56) References Cited

U.S. PATENT DOCUMENTS

| | | |
|---|---|---|
| 6,753,561 B1 | 6/2004 | Rinerson et al. |
| 2006/0268594 A1* | 11/2006 | Toda ........................ 365/100 |
| 2007/0132049 A1 | 6/2007 | Stipe |
| 2008/0304308 A1 | 12/2008 | Stipe |
| 2011/0210303 A1 | 9/2011 | Muraoka et al. |

FOREIGN PATENT DOCUMENTS

| | | |
|---|---|---|
| JP | 05-347422 | 12/1993 |
| JP | 06-097466 | 4/1994 |
| JP | 2007-165873 | 6/2007 |
| JP | 2007-188977 | 7/2007 |
| WO | WO 2010/026624 | 3/2010 |
| WO | WO 2010/026625 | 3/2010 |

OTHER PUBLICATIONS

International Search Report issued Apr. 27, 2010 in PCT/JP2010/051141 filed Jan. 28, 2010.

(Continued)

*Primary Examiner* — Telly Green
(74) *Attorney, Agent, or Firm* — Oblon, Spivak, McClelland, Maier & Neustadt, L.L.P.

(57) ABSTRACT

According to one embodiment, a nonvolatile semiconductor memory device includes a plurality of first interconnections arranged parallel, a plurality of second interconnections arranged parallel to intersect the first interconnections, and memory cell portions respectively arranged at intersecting portions between the first and second interconnections and each configured by laminating a variable-resistance element and a diode element. The diode element has a laminated structure having a first insulating film, a conductive fine grain layer and a second insulating film. The physical film thickness of the second insulating film is greater than the first insulating film and the dielectric constant of the second insulating film is greater than the first insulating film.

15 Claims, 13 Drawing Sheets

(56) References Cited

OTHER PUBLICATIONS

Q. Wan, et al.; "Resonant tunneling of Si nanocrystals embedded in $Al_2O_3$ matrix synthesized by vacuum electron-beam co-evaporation"; Applied Physics Letters, 2002, vol. 81, No. 3, pp. 538-540.

Edward H. Nicollian, et al.; "Electrical properties of a silicon quantum dot diode"; J. Appl. Phys., 1993, vol. 74, No. 6, pp. 4020-4025.

Chang-Hee Cho, et al.; "Room-temperature Coulomb blockade effect in silicon quantum dots in silicon nitride films"; Applied Physics Letters, 2006, vol. 89, pp. 013116-1-013116-3.

Ryuji Ohba, et al.; "25 nm Planar Bulk SONOS-type Memory with Double Tunnel Junction"; IEDM Tech., 2006, pp. 06-959-06-962.

Naoki Yasuda, et al.; "The Relation between Dielectric Constant and Film Composition of Ultra-Thin Silicon Oxynitride Films: Experimental Evaluation and Analysis of Nonlinearity"; Extended Abstracts of the 2001 International Conference on Solid State Devices and Materials, 2001, pp. 486-487.

Toshifumi Irisawa, et al.; "High-Performance Uniaxially Strained SiGe-on-Insulator pMOSFETs Fabricated by Lateral-Strain-Relaxation Technique"; IEEE Transactions on Electron Devices, 2006, vol. 53, No. 11, pp. 2809-2815.

\* cited by examiner

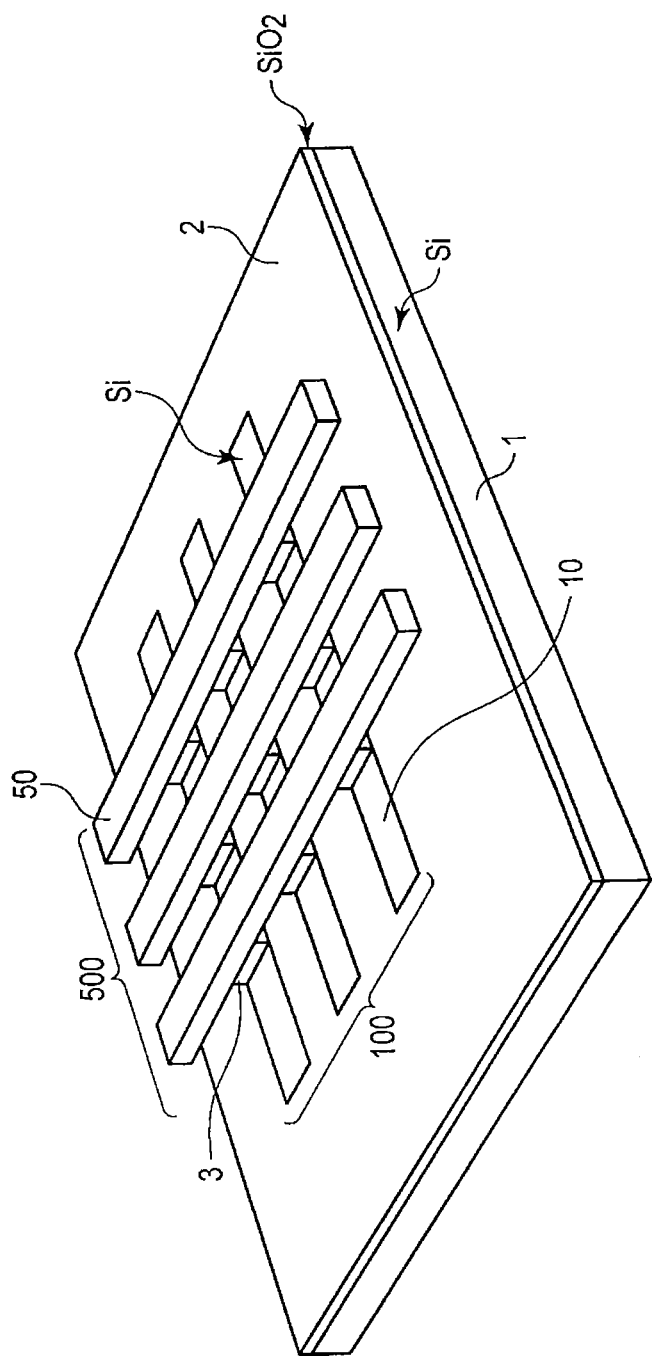
F I G. 8

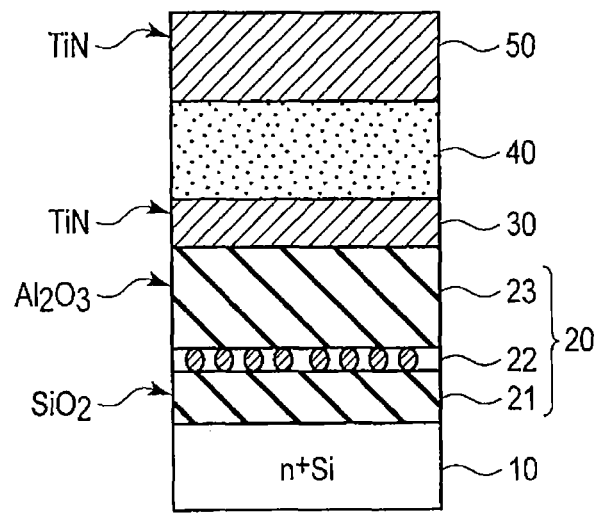
F I G. 9
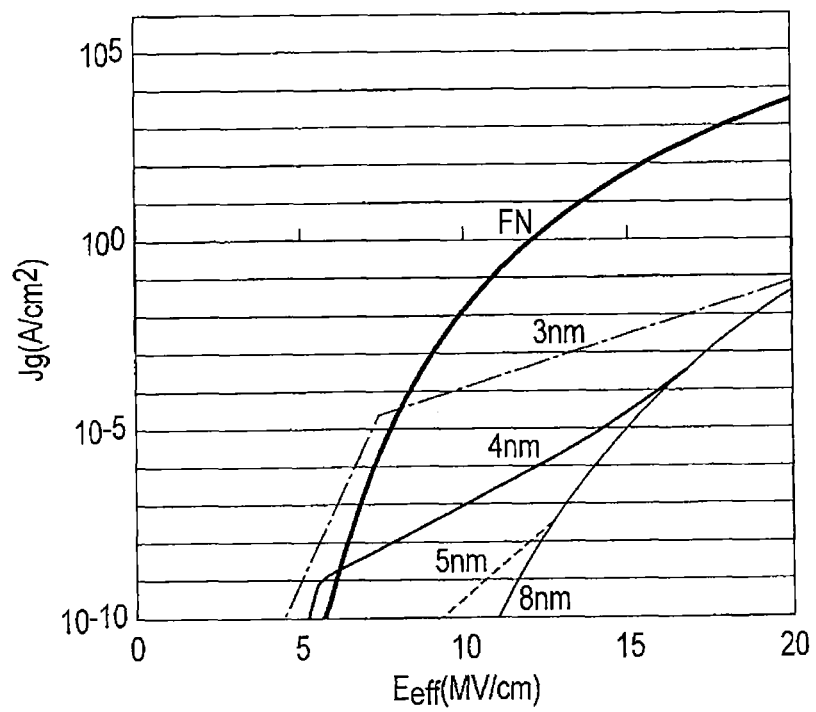
F I G. 10

| Metal element | Oxide | Oxynitride | Aluminate | Silicate | Aluminum silicate |
|---|---|---|---|---|---|
| Hf | HfO2 | HfON | HfAlO | HfSiO | HfAlSiO |
| Zr | ZrO2 | ZrON | ZrAlO | ZrSiO | ZrAlSiO |
| La | La2O3 | LaON | LaAlO | LaSiO | LaAlSiO |
| Ce | CeO2 | CeON | CeAlO | CeSiO | CeAlSiO |
| Y | Y2O3 | YON | YAlO | YSiO | YAlSiO |
| Ti | TiO2 | TiON | TiAlO | TiSiO | TiAlSiO |

F I G. 11

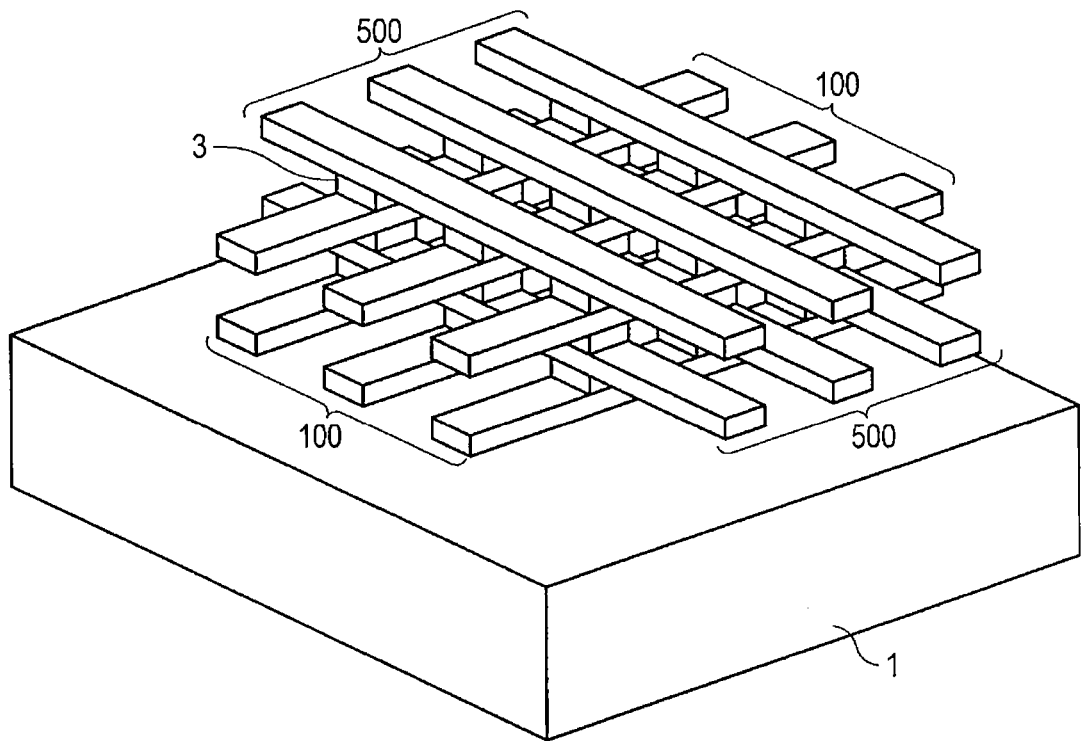
F I G. 19
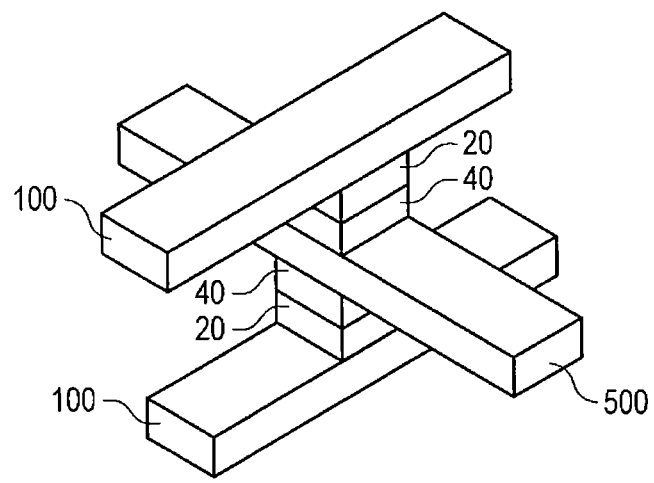
F I G. 20

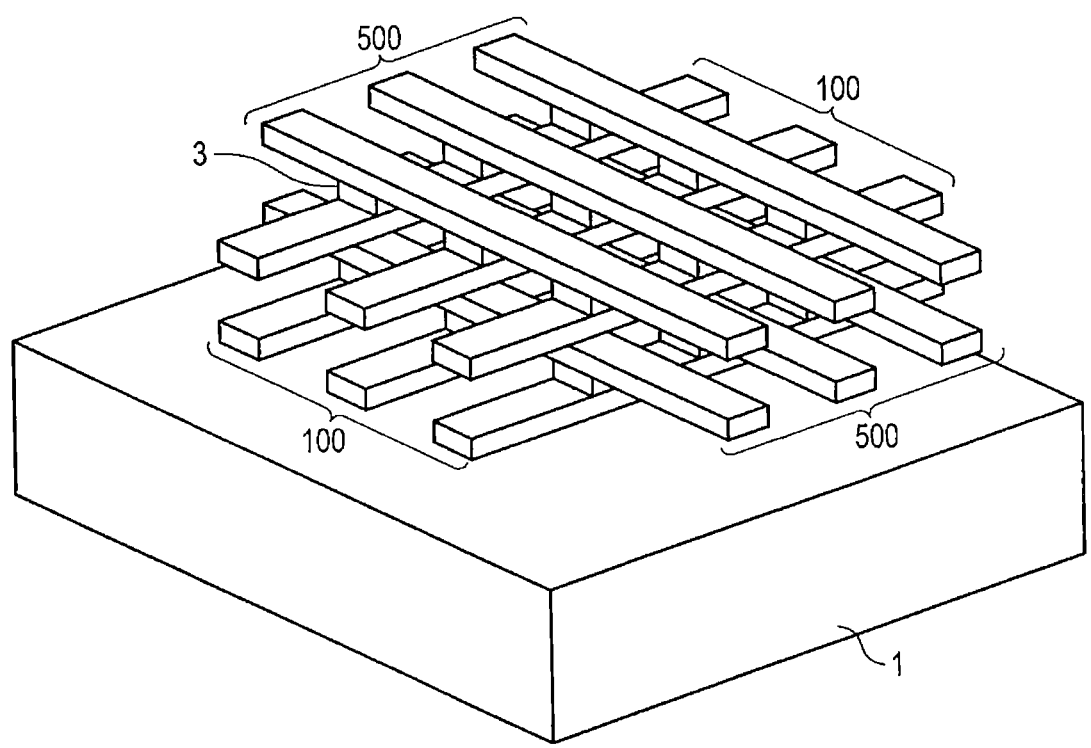
F I G. 21

From # NONVOLATILE SEMICONDUCTOR MEMORY DEVICE

CROSS-REFERENCE TO RELATED APPLICATIONS

This application is a Continuation application of PCT Application No. PCT/JP2010/051141, filed Jan. 28, 2010, the entire contents of which are incorporated herein by reference.

FIELD

Embodiments described herein relate generally to a nonvolatile semiconductor memory device having memory cell portions each configured by a laminated structure of a variable-resistance element and diode element and arranged at intersecting portions of interconnections that intersect one another.

BACKGROUND

Recently, as one of a number of new memory elements that may be successor candidates to a floating gate NAND flash memory, a resistance-change memory (resistive random access memory [ReRAM]) is being intensely studied and developed. The ReRAM cell array is often configured to have a cross-point structure that has a series circuits of variable-resistance elements and diode elements each arranged between interconnections (at an intersection between a word line and a bit line). Further, a nonvolatile semiconductor memory device with large capacity can be configured by laminating cell arrays with the cross-point structure to form a three-dimensional structure.

In the cell array with the cross-point structure, it is necessary to suppress a current flowing through a non-selected cell when the resistance of a selected cell is read by applying a voltage. Therefore, the structure having a variable-resistance element and a non-ohmic element (diode) connected in series is inserted at the intersection between the word line and bit line. Particularly, it is necessary to use a diode having a sufficient rectification characteristic to suppress a reverse current in the non-selected element when the variable-resistance element performs a unipolar operation.

Generally, a pin diode is used as the diode element of the ReRAM cell array. In this case, the film thickness of the diode becomes large and the aspect ratio of the whole memory cell becomes large. For this reason, it is extremely difficult to miniaturize the cell array. Therefore, recently, the configuration obtained by arranging a variable-resistance element and a metal/insulator/metal (MIM) diode in series between the word line and the bit line is reported (for example, see T. Irisawa et al., IEEE Trans. Electron Devices, 53, 2809 [2006]).

However, if the MIM diode is used as the diode element of the ReRAM cell array, the following problem has occurred. That is, since the MIM diode is configured to have a sandwiched insulating film, it is difficult to acquire a large forward current. Further, a problem that it is difficult to obtain a difference between the forward current and reverse current in the MIM diode and a sufficient rectification characteristic cannot be obtained also occurs.

BRIEF DESCRIPTION OF THE DRAWINGS

FIG. 8 is a perspective view showing the configuration of a memory cell array of a nonvolatile semiconductor memory device according to a first embodiment.

FIG. 9 is a cross-sectional view showing the configuration of a memory cell portion used in the memory cell array of FIG. 8.

FIG. 10 is a diagram showing the reverse current characteristic of a diode when the film thickness of an upper insulating film is changed.

FIG. 11 is a diagram showing materials used as the upper insulating film of a diode element.

FIG. 19 is a perspective view showing the configuration of a memory cell array of a nonvolatile semiconductor memory device according to a modification.

FIG. 20 is a cross-sectional view showing the configuration of a memory cell portion used in the memory cell array of FIG. 19.

FIG. 21 is a perspective view showing the configuration of a memory cell array of a nonvolatile semiconductor memory device according to another modification.

DETAILED DESCRIPTION

Figure 1:
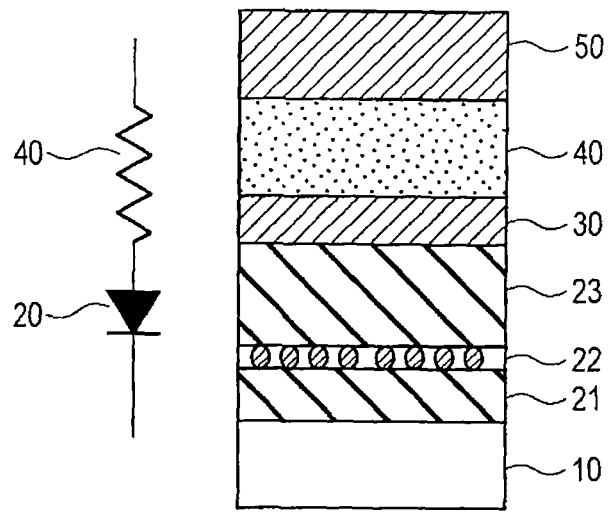
FIG. 1 is a schematic view for illustrating the configuration of a memory cell portion used in a nonvolatile semiconductor memory device.

In general, according to one embodiment, a nonvolatile semiconductor memory device comprises a first interconnection layer having a plurality of first interconnections arranged parallel to one another on a substrate, a second interconnection layer having a plurality of second interconnections provided separately from the first interconnection layers and arranged parallel to one another to intersect the first interconnections, and memory cell portions respectively arranged at intersecting portions between the first interconnections and second interconnections and each configured by laminating a variable-resistance element that stores a state of different resistance as information and a diode element having a rectifying characteristic. The diode element has a laminated structure including a first insulating film, a conductive fine grain layer containing conductive fine grains and a second insulating film sequentially arranged from the side of the first interconnection layer. The physical film thickness of the second insulating film is greater than the physical film thickness of the first insulating film and the dielectric constant of the second insulating film is greater than the dielectric constant of the first insulating film.

The present embodiment is explained below with reference to the drawings.

Principle of Embodiment

First, the concept of a diode of a memory cell portion used in a nonvolatile semiconductor memory device of this embodiment is explained with reference to FIG. 1. An MIM diode element 20 is formed by laminating a lower insulating film (bottom oxide: first insulating film) 21, a fine grain layer 22 containing conductive fine grains and an upper insulating film (top oxide: second insulating film) 23 on a lower electrode 10 functioning as a word line (first interconnection layer). An intermediate electrode 30 is disposed on the upper insulating film 23 and a variable-resistance film (variable-resistance element) 40 is disposed thereon. Further, an upper electrode 50 functioning as a bit line (second interconnection layer) is disposed on the variable-resistance film 40.

In this case, if the film thicknesses (physical film thickness: that indicates the physical film thickness when it is simply expressed as film thickness) of the lower insulating film 21 and the upper insulating film 23 are compared, the upper insulating film 23 is thicker than the lower insulating film 21. Further, if the dielectric constants of the lower insulating film 21 and upper insulating film 23 are compared, the dielectric constant of the upper insulating film 23 is greater than that of the lower insulating film 21. The intermediate electrode 30 may be omitted in some cases in the above structure. Additionally, a barrier metal may sometimes be arranged on the surfaces of the respective electrodes (lower electrode 10, intermediate electrode 30, upper electrode 50) to prevent a reaction between the insulating films 21, 23 and the variable-resistance film 40.

If the above diode structure is used, an increase in the forward current and suppression of the reverse current can be simultaneously achieved. The principle thereof is explained below.

Figure 2:
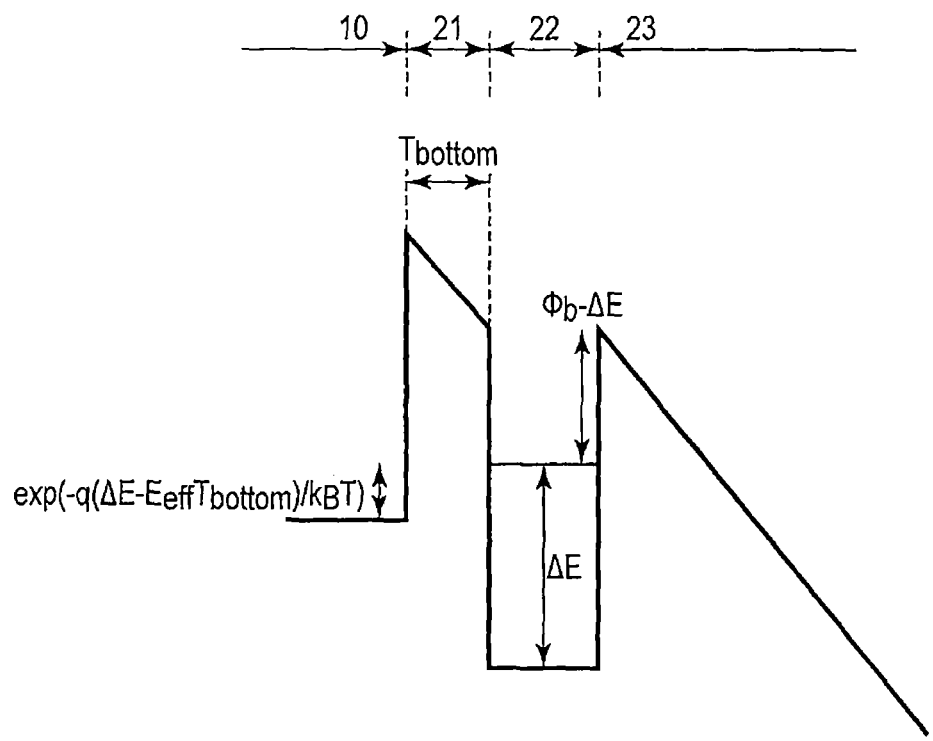
FIG. 2 is an energy band diagram of a conduction band of a diode of the memory cell portion of FIG. 1.

FIG. 2 is an energy band diagram of a conduction band of the diode of the memory cell portion with the structure of FIG. 1. The energy level of conductive fine grains in the fine grain layer 22 sandwiched between the insulating films 21 and 23 rises from the conduction band end due to the quantum effect and coulomb blockade effect when the grain diameter thereof is reduced to approximately several nm. In FIG. 2, the amount is expressed as $\Delta E$.

If the energy level rises as described above, electrons passing through the lower insulating film 21 by tunneling and entering the energy level of the conductive fine grains may sense the conduction band barrier height of the upper insulating film 23 effectively lower by the rise amount $\Delta E$ of the energy level when they pass through the upper insulating film 23 (for example, see Irisawa et al., IEEE Trans. Electron Devices, 53, 2809 [2006]). That is, if the original barrier height of the upper insulating film 23 is set to $\phi b$, the effective barrier height of the upper insulating film 23 is set to $(\phi b - \Delta E)$ in a tunnel insulating film using conductive fine grains. Therefore, an effect that the tunnel current increases in the forward operation of the diode into which electrons are injected from the lower electrode 10 can be attained.

The effect appears in an electric field region (intermediate electric field region) in which thermal excitation of carriers from the lower electrode 10 to the lower insulating film 21 is not required. However, if the electric field becomes stronger, the thus increased tunnel current is finally rate-determined according to the tunneling rate of the lower insulating film. Generally, since the current density required for the set/reset operation of the variable-resistance film 40 is extremely high, the diode is used in a high-intensity electric field region (a region in which a current is rate-determined by means of the lower insulating film 21). Therefore, the set/reset operation of the variable-resistance film 40 can be performed in a state in which the forward current of the diode is increased by adequately reducing the film thickness of the lower insulating film 21.

On the other hand, in order to suppress the reverse leakage current of a non-selected memory cell, the film thickness of the upper insulating film 23 into which electrons are injected is preferably made greater in comparison with that of the lower insulating film 21. If the film thickness of the upper insulating film 23 is made sufficiently large, the reverse leakage current is determined only by means of the upper insulating film 23. If the dielectric constant of the upper insulating film 23 is set greater than that of the lower insulating film 21 in this state, the reverse leakage current can be further suppressed.

In the case of this state, if the dielectric constant of the upper insulating film 23 is increased, it may become necessary to check whether a side effect of deterioration in the forward current occurs although the effect of a reduction in the reverse current is acquired. However, as described before, the required forward current is extremely large and an operation is performed in a region in which a current is rate-determined by means of the lower insulating film 21. Therefore, an increase in the dielectric constant of the upper insulating film 23 does not give a large influence to suppression of the forward current.

The above description is the basic principle of this embodiment. In the above explanation, "conductive fine grains" indicate semiconductor or metal fine grains. In this case, the metal is used in a wide meaning to indicate a material that can supply free electrons.

In this case, for reference, the energy rise amount $\Delta E$ when Si is used as conductive fine grains is calculated as a function of the size (grain diameter) of Si fine grains. The functional relationship becomes absolutely necessary to determine the size of the conductive fine grains.

Figure 3:
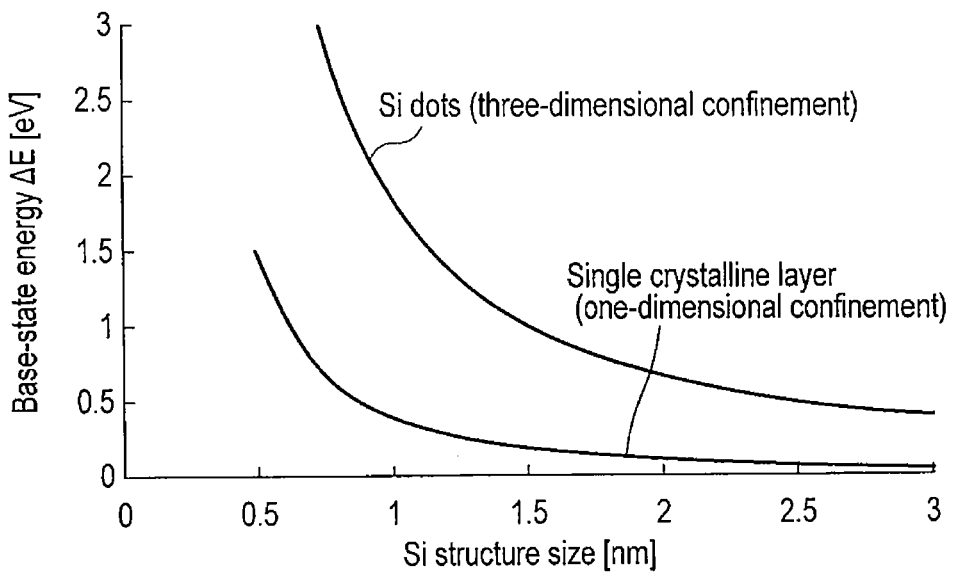
FIG. 3 is a diagram showing the relationship between the Si structure size and ground-state energy $\Delta E$ (eV).

FIG. 3 shows the result obtained by calculating an energy rise amount (ground-state energy): $\Delta E$ (eV) as a function of the film thickness of a single crystalline Si thin film as a reference material and the size (grain diameter) of Si fine grains in the film thickness direction. Based on the calculation result, it is understood that $\Delta E$ becomes extremely large by using Si fine grains instead of the uniform thin film of single crystalline Si.

It is desirable to set the size (grain diameter) of Si fine grains in a range of 0.7 to 3.0 nm. This is because the lower limit of $\Delta E$ is determined based on a condition that it is sufficiently greater than thermal energy ($\sim 10$ kBT=0.3 eV) and the upper limit of $\Delta E$ is determined based on a condition that it is less than conduction band offset (~3 eV) between SiO$_2$ and Si. The range of the grain diameter of Si fine grains that satisfies the condition of 0.3 eV<ΔE<3 eV is set in a range of approximately 0.7 to 3.0 nm by referring to FIG. 3.

The preferable range of the grain diameter described above almost coincides with a preferable range when fine grains are formed of another semiconductor material or metal material. At this time, since the Si—Si bonding length is approximately 0.2 nm, the absolute lower limit of the grain diameter of the Si fine grains is 0.2 nm.

(Calculation Example of Current-Electric Field Characteristic: Forward Current)

Figure 4:
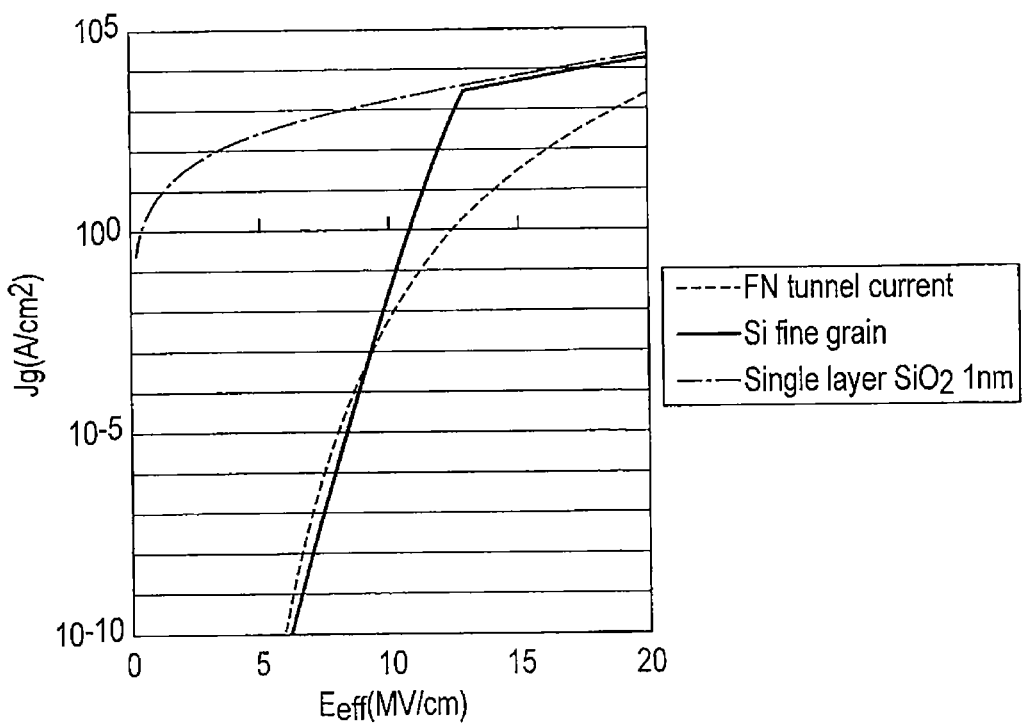
FIG. 4 is a diagram showing the electric field dependency of a forward current in the device structure having a tunnel insulating film.

FIG. 4 is a diagram showing the current-electric field characteristic in the device structure having a tunnel insulating film. FIG. 4 shows an example for the purpose of indicating the way of increasing a forward current in the tunnel insulating film containing conductive fine grains.

The device structure of the present calculation example is a structure obtained by arranging a lower electrode, an SiO$_2$ film with a film thickness of 1 nm formed thereon as a lower insulating film, SiO$_2$ fine grains with a grain diameter of 1 nm formed thereon as conductive fine grains, an SiO$_2$ film with a film thickness of 3 nm formed thereon as an upper insulating film, and an upper electrode formed thereon. The current-electric field characteristic when electrons are injected from the lower electrode of the device is estimated by use of the Wentzel-Kramers-Brillouin (WKB) method. In the following description, the effective electric field (SiO$_2$ conversion electric field) is expressed as $E_{eff}$.

In FIG. 4, in a low electric field region (5 MV/cm<$E_{eff}$<10 MV/cm), a current flowing through the device structure ("Si fine grains" in the example of the drawing) is suppressed to the same degree as a Fowler-Nordheim (FN) tunnel current in a thick SiO$_2$ film although the film thickness of the lower insulating film is small. As explained with reference to FIG. 2, the reason is that an energy difference (potential difference) occurs from the lower electrode to the ground-state energy level of Si fine grains in the low electric field region and only carriers thermally excited in the lower electrode can reach the energy level of Si fine gains.

Next, in an intermediate electric field region (10 MV/cm<$E_{eff}$<13 MV/cm), the barrier height of the upper insulating film with respect to electrons that enter the intermediate energy level becomes effectively low and the effect of the Si fine grains appears significantly (the upper insulating film whose barrier height is low is set into a rate-determining step for a current). Therefore, an increasing rate of the tunnel current in the present device structure with respect to the electric field is higher in comparison with that of the FN tunnel current of a thick SiO$_2$ film.

Finally, in a high electric field region (13 MV/cm<$E_{eff}$), an increasing rate of the current with respect to the electric field becomes dull in comparison with that of the intermediate electric field region. The current-electric field characteristic of this region coincides with the current-electric field characteristic with respect to an SiO$_2$ single-layer film with the same film thickness (1 nm) as that of the lower insulating film. This means that the process in which electrons enter the energy level of Si fine grains via the lower insulating film is set into a rate-determining step in which the current amount is determined in the high electric field region.

Typically, the current level required in the set/reset operation of the variable-resistance film is approximately $10^4$ to $10^5$ A/cm$^2$ and extremely high. Therefore, it may be considered that the forward operation of the diode is performed in a "high electric field region", that is, in an electric field region in which the current is rate-determined in the lower insulating film. As a result, in order to satisfy the requirement specification of the forward current of the diode, it is necessary to reduce the film thickness of the lower insulating film and securely attain a current in the high electric field region.

Figure 5:
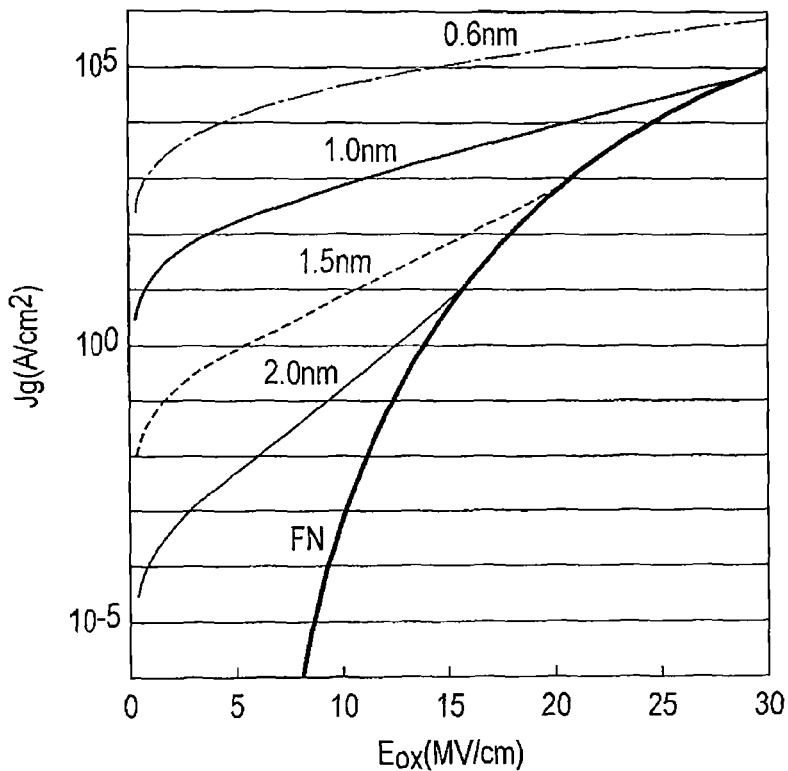
FIG. 5 is a diagram showing the film thickness dependency of the current-electric field characteristic of an extremely thin $SiO_2$ film (single-layer film).

FIG. 5 is a diagram showing the film thickness dependency of the current-electric field characteristic of a single-layer extremely thin SiO$_2$ film (0.6 to 2.0 nm). As described before, the current value is determined only by means of the low-side insulating film in the "high electric field region". Therefore, as shown in FIG. 5, the film thickness of the lower insulating film required for satisfying the specification of the forward current can be estimated based on the film thickness dependency of the current characteristic of the single-layer SiO$_2$ film. The important thing at this time is that the film must be used in the electric field region in which no dielectric breakdown occurs when the insulating film is used as a portion of the ReRAM diode.

Figure 6:
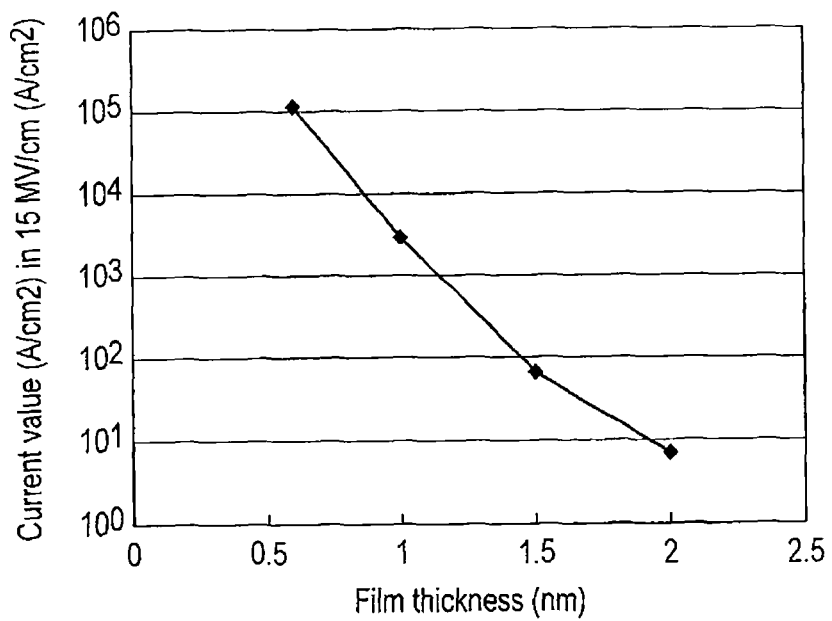
FIG. 6 is a diagram showing a variation in the forward current of the diode with respect to the film thickness of a lower insulating film.

In future, it is necessary to check the reliability of the ReRAM diode. The tunnel insulating film of a nonvolatile memory of, for example, metal-oxide-nitride-oxide-silicon (MONOS) is operated without causing the dielectric breakdown with an effective electric field of $E_{eff}$=approximately 15 MV/cm. If the ReRAM diode is operated in a range up to the above electric field, it is estimated by referring to this that the breakdown of the insulating film can be avoided. Therefore, the film thickness of the lower insulating film that satisfies the requirement specification of the forward current of the diode is estimated by using the relationship between the SiO$_2$ film thickness and the current in the effective electric field 15 MV/cm. The result is shown in FIG. 6.

The requirement specification of the forward current is typically $10^4$ A/cm$^2$ or more and the film thickness corresponding to the current density becomes 0.87 nm. If the presence of roughness of approximately one atom layer on the SiO$_2$ film is taken into consideration, the film thickness that permits the current density of $10^4$ A/cm$^2$ or more to be achieved with 15 MV/cm should be set to approximately 0.9 nm or less. From the above description, in this embodiment, it is understood that the film thickness of the lower insulating film that can satisfy the requirement specification of the forward current of the ReRAM diode should be set to approximately 0.9 nm or less.

The above consideration is made for a case wherein the lower insulating film is the SiO$_2$ film. When the characteristic for an effective electric field (SiO$_2$ conversion electric field) of a current in a case where a silicon oxynitride film is used instead of the SiO$_2$ film is estimated by use of the WKB method, it is almost the same as that in the case of SiO$_2$. Therefore, the upper limit of the film thickness of the lower insulating film when the silicon oxynitride film is used should be set to 0.9 nm or less with the electric film thickness (EOT: SiO$_2$ conversion film thickness). The relationship between the dielectric constant and the film composition (nitride concentration) required for EOT calculation of the silicon oxynitride film can be detected by referring to C. S. Smith, Phys. Rev., 94, 42 (1954), for example.

(Calculation Example of Current-Electric Field Characteristic: Reverse Current)

The reverse current of the diode of FIG. 1 corresponds to a case wherein electrons are injected from the upper insulating film in opposition to the case of the forward current. In this embodiment, the reverse current is greatly suppressed by setting the dielectric constant of the upper insulating film greater than the dielectric constant of the lower insulating film. Further, it is desirable to make the upper insulating film sufficiently thick and suppress an influence (an increase in the current) given by conductive fine grains to the reverse current.

There is a fear that the upper insulating film with a large dielectric constant introduced to suppress the reverse current may give a bad influence to an increase in the forward current. However, as will be described below, if the current-electric field characteristic estimated by use of the WKB method with respect to the typical film structure of this embodiment is observed, it is understood that introduction of the upper insulating film with a large dielectric constant does not substantially cause deterioration in the forward current.

Figure 7A:
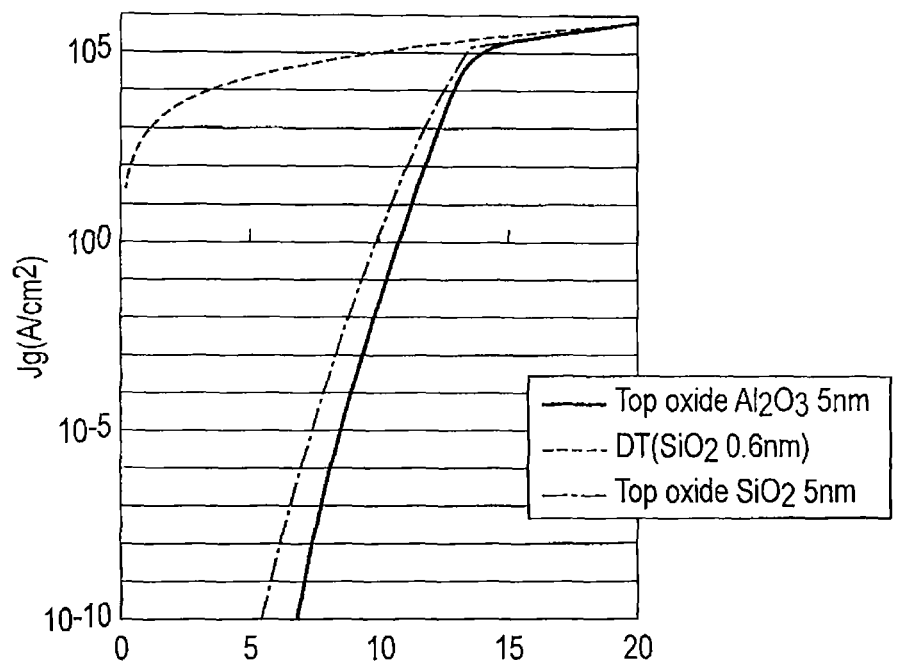
FIGS. 7A, 7B are diagrams showing the current-electric field characteristics of the forward current and reverse current of the diode when $Al_2O_3$ and $SiO_2$ are used as an upper insulating film.
Figure 7B:
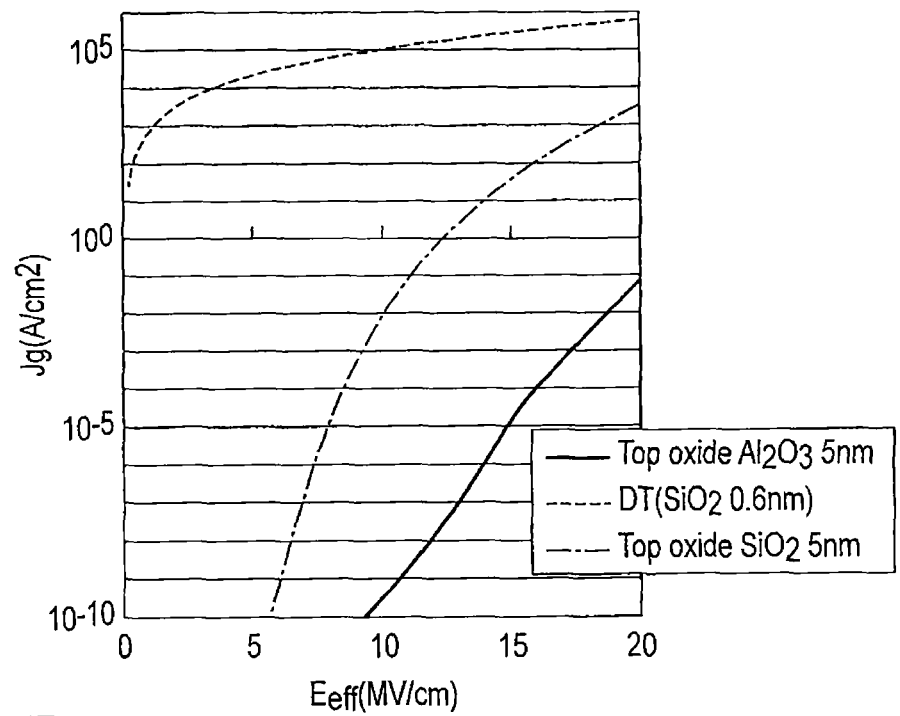

FIG. 7A shows the current-electric field characteristic in a "forward direction" of the tunnel insulating film diode using an $SiO_2$ film with a thickness of 0.6 nm as the lower insulating film, Si fine crystals with a diameter of 1.6 nm as conductive fine grains and an $Al_2O_3$ film with a thickness of 5.0 nm as the upper insulating film. Further, FIG. 7B is a diagram showing the current-electric field characteristic in a "reverse direction" of the tunnel insulating film diode using the insulating films of the same materials and thicknesses as those described above. For comparison, the current-electric field characteristic in the "reverse direction" when an $SiO_2$ film with a thickness of 5.0 nm is used as the upper insulating film is also shown.

As is understood from FIG. 7B, the reverse current when the insulating film with a large dielectric constant is introduced as the upper insulating film is suppressed by many digits in comparison with a case wherein the upper insulating film is an $SiO_2$ film. On the other hand, when the current-electric field characteristics in the forward direction corresponding to the above structures are viewed (FIG. 7A), it is observed that the forward current in the intermediate electric field region is slightly reduced if an insulating film with a large dielectric constant is introduced as the upper insulating film. However, both currents become current amounts rate-determined by means of the lower insulating film in the high electric field region corresponding to the requirement specification of the forward current. Therefore, even if the upper insulating film is either a high-k insulating film or $SiO_2$ film, substantially the same forward current amount is obtained with substantially the same electric field. That is, it is possible to attain a significant effect that the reverse current can be significantly reduced by increasing the dielectric constant of the upper insulating film, but the forward current is not substantially influenced.

Summary of Principle of Present Embodiment

The above description is made to explain the principle of this embodiment. That is, as shown in FIG. 1, this embodiment has a feature that a ReRAM diode is configured by using a fine grain layer (tunnel insulating film) containing conductive fine grains. The insulating film 23 disposed on the variable-resistance element 40 side with the conductive fine grains set as a boundary is defined as an "upper insulating film" and the insulating film 21 disposed on the opposite side of the variable-resistance element 40 is defined as a "lower insulating film".

At this time, if the film thicknesses of the lower insulating film 21 and upper insulating film 23 are compared, the upper insulating film 23 is thicker. Further, if the dielectric constants of the lower insulating film 21 and upper insulating film 23 are compared, it is featured that the upper insulating film 23 has a greater dielectric constant. It is desirable to set the film thickness of the lower insulating film 21 corresponding to the typical requirement specification of the forward current in the range of 0.3 to 0.9 nm. By utilizing the above film structure, it becomes possible to increase the forward current of the diode and suppress the reverse current without degrading the forward current. In this case, the conductive fine grains indicate fine grains formed of semiconductor or metal, and as explained before, it is desirable to set the diameter thereof in the range of 0.7 to 3.0 nm.

Since this embodiment is featured in the insulating film that configures the diode element, conductive materials can be widely used as electrodes provided on both ends thereof. Therefore, in this embodiment, various cases of metal layer/metal layer, metal layer/semiconductor layer, semiconductor layer/semiconductor layer and the like may be considered as combinations of materials of both of the electrodes. In this case, the metal widely indicates a material having free electrons that contribute to the electrical conduction. Therefore, as the metal layer, something having the conductivity such as a metal nitride, metal silicate, metal carbide and the like can be widely used in addition to a single metal element. Further, as the semiconductor layer, a single semiconductor layer of Si, Ge or the like and a compound semiconductor layer of GaN or the like can be widely used. Of course, something obtained by adding dopant impurities into a semiconductor layer to increase the conductivity is contained in the semiconductor layer as the electrode of this embodiment.

Further, in this embodiment, it is assumed that the variable-resistance element mainly performs a unipolar operation. Additionally, the diode element of this embodiment is designed to have a significant difference in the magnitude between the forward current and the reverse current and has a sufficient rectification characteristic. However, the applicable range of this embodiment is not limited to a case where the variable-resistance element performs a unipolar operation and can be expanded to a case where it performs a bipolar operation. In the case of a bipolar element, the current-electric field characteristic that is symmetrical is required. Therefore, for example, a configuration obtained by serially connecting the diode elements of this embodiment with the polarities thereof set in an opposite direction can be used. The connection form can be realized by connecting the cathodes of the diode elements of this embodiment to each other or connecting the anodes thereof to each other.

Next, the present embodiment is specifically explained with reference to the drawings. Further, in the drawings explained below, portions having the same symbols indicate the same portions and the repetitive explanation thereof is omitted.

First Embodiment

FIG. 8 is a perspective view showing the configuration of a memory cell array of a nonvolatile semiconductor memory device according to a first embodiment. In the drawing, 1 denotes an Si substrate, 2 an $SiO_2$ film, 3 a memory cell portion, 10 a first interconnection (lower electrode), 50 a second interconnection (upper electrode), 100 a first interconnection layer and 500 a second interconnection layer.

The first interconnection layer 100 is formed by arranging a plurality of first interconnections 10 parallel to one another on the Si substrate 1. The first interconnection layer 100 is formed by selectively oxidizing the surface portion of the Si substrate 1 except a portion that is used as word lines (WL). The second interconnection layer 500 is formed by arranging a plurality of second interconnections 50 parallel to one another to intersect the interconnections 10 of the first interconnection layer 100 and is provided separately from the first interconnection layer 100. The second interconnection layer 500 is used as bit lines (BL).

The memory cell portions 3 are arranged at the intersecting portions between the respective interconnections 10 and 50 configuring the first interconnection layer 100 and second interconnection layer 500. The memory cell portion 3 is configured by laminating a variable-resistance element that stores the state of different resistance as information and a diode element having a rectifying characteristic. Thus, the memory cell array has a cross-point structure having the memory cell portions 3 each sandwiched at the intersecting portion between the lower electrode 10 and the upper electrode 50.

FIG. 9 shows the specific configuration of the memory cell portion used in this embodiment. The lower electrode 10 that forms a portion of the first interconnection layer 100 as a word line is formed of an n$^+$-type Si layer and a diode element 20 with the MIM structure having a conductive fine grain layer 22 sandwiched between insulating films 21 and 23 is provided thereon. That is, an SiO$_2$ film with a film thickness of 0.6 nm is provided as the lower insulating film 21 on the Si layer 10 and the fine grain layer 22 formed of Si fine grains (Si fine crystals) with a grain diameter of 1.6 nm as conductive fine grains is provided thereon. Further, an Al$_2$O$_3$ film with a film thickness of 5 nm as the upper insulating film 23 is provided on the fine grain layer 22. The fine grain layer 22 is formed by dispersing Si fine grains into a single-layer film and a portion of the lower insulating film 21 or upper insulating film 23 enters between the adjacent Si fine grains.

A TiN film is formed on the upper insulating film 23 as an intermediate conductive electrode 30 and a variable-resistance film 40 is provided thereon. The resistance of the variable-resistance film 40 can be varied according to a voltage, current, heat, chemical energy or the like and can store the state of different resistance as information. A TiN film is laminated as the upper electrode 50 that forms a portion of the second interconnection layer 500 on the variable-resistance film 40.

In this embodiment, the grain diameter of the Si fine grain in the fine grain layer 22 is preferably set in the range of 0.7 to 3.0 nm. As is explained in FIG. 3, the rise amount ΔE of the energy level is a function of the diameter of the Si fine grain. The lower limit of ΔE is determined based on a condition that it is sufficiently greater than thermal energy (typically, ~10 kBT, 0.3 eV at normal temperature). Further, the upper limit of ΔE will be determined based on the fact that it is less than the conduction band offset (~3 eV) between SiO$_2$ and Si. The range of the diameter of the Si fine grain that satisfies 0.3 eV<ΔE<3 eV is a range of approximately 0.7 to 3.0 nm with reference to FIG. 3.

Since the length in the film thickness direction of the conductive fine grain is important in the diode of this type, the diameter of the Si fine grain should be set to the diameter (length) with respect to the film thickness direction. Further, if the Si fine grain is not a complete sphere, the evaluation of the dimension can be made by replacing the diameter thereof by the diameter of a sphere having the same volume as the volume thereof. Further, the desirable diameter range is roughly the same range not only in the Si fine grain but also in a fine grain of another conductive material.

The desirable film thickness range of the film thickness of the lower insulating film 21 arranged on the lower side of the Si fine grains can be considered as follows. When a silicon oxide film is used as the lower insulating film 21, it is preferable to set the film thickness in the range of 0.3 to 0.9 nm. This is because the film thickness of at least 0.3 nm is required from the requirement of forming bonds of atoms in order to form the insulating film. Further, as explained before, this is because it is required to set the film thickness of the lower insulating film to 0.9 nm or less with respect to the typical requirement specification of the forward current in order to satisfy the specification of the forward current.

Further, the range of the film thickness of the upper insulating film 23 arranged on the upper side of the Si fine grains is considered as follows. FIG. 10 shows the result obtained by changing the film thickness of the upper insulating film 23 in the range of 3 to 8 nm in the structure having the lower insulating film 21, conductive fine grains, upper insulating film 23 and conductive electrode 30 laminated on the lower electrode 10 and estimating a reverse current of the diode by use of the WKB method. In this case, an SiO$_2$ film with a thickness of 0.6 nm is used as the lower insulating film 21, an Si fine crystal with a diameter of 1.6 nm is used as the conductive fine grain and an Al$_2$O$_3$ film is used as the upper insulating film 23.

As is understood from the drawing, an FN tunnel current of Al$_2$O$_3$ is obtained if the film thickness of the Al$_2$O$_3$ film is 8 nm. Also, when the film thickness of the Al$_2$O$_3$ film is greater than 8 nm (for example, 10 nm), an FN tunnel current characteristic can be obtained as in the above case (not shown). Further, when the film thickness of the Al$_2$O$_3$ film is set to 5 nm, the skirt of a current starts to appear in the intermediate electric field region. The skirt of the current becomes significant when the film thickness of the Al$_2$O$_3$ film is set to 4 nm or less and the effect obtained by introducing Al$_2$O$_3$ in the upper insulating film 23 may be lost. In FIG. 10, the abscissa indicates the effective electric field (SiO$_2$ conversion electric field).

Judging from the above result, it can be said that the lower limit of the desirable film thickness range of the Al$_2$O$_3$ film used as the upper insulating film 23 is 5 nm in the case of the diode structure of this embodiment.

Next, the upper limit of the desirable film thickness range of the Al$_2$O$_3$ film is explained as follows. If the film thickness of the Al$_2$O$_3$ film becomes greater, an application voltage becomes excessively high and a heavy load is applied to the booster circuit for the power source voltage. Therefore, for example, if a voltage applied to an Al$_2$O$_3$ portion with the effective electric field $E_{eff}$=15 MV/cm is suppressed to approximately 10 V or less, it is desirable to set the electrical film thickness (EOT) of Al$_2$O$_3$ less than approximately 6.5 nm or set the actual film thickness (physical film thickness) less than 18 nm.

When the above consideration is summarized, the desirable film thickness range of the Al$_2$O$_3$ film used as the upper insulating film 23 is set to the range of 5 to 18 nm.

The lower limit of the film thickness range of the upper insulating film 23 is determined based on a condition that Si fine crystals as conductive fine grains cannot be observed within the direct tunneling distance of electrons when the reverse bias is applied. Therefore, if the upper insulating film 23 is formed of a material other than Al$_2$O$_3$, the lower limit of the desirable film thickness range of the upper insulating film 23 can be determined based on the same consideration.

As the high-permittivity (high-k) insulating film used as the upper insulating film 23, various materials other than Al$_2$O$_3$ can be used. As one example, an oxide, oxynitride, aluminate, silicate or aluminium silicate of a metal such as Hf, Zr, La, Ce, Y, Ti or the like may be used. In order to enhance the performance and reliability of the above films, nitrogen may be added. An example of materials used as the upper insulating film 23 of the diode element is collectively shown in FIG. 11.

Since the composition of aluminate, silicate and aluminium silicate can be changed, only constituting elements are shown.

Finally, the work functions of electrodes arranged above and below the insulating film of the diode element are considered. In this embodiment, n$^+$-type Si (approximately 4 eV)

whose work function is relatively small is used on the interface of the lower electrode 10 (word line electrode) that contacts the lower insulating film 21 ($SiO_2$). The electron injection efficiency from the lower electrode 10 to the lower insulating film 21 ($SiO_2$) can be enhanced and the forward current can be increased by using the electrodes having the small work function.

As the electrode 30 that contacts the upper insulating film 23 ($Al_2O_3$), TiN whose work function is as relatively large as approximately 4.6 eV is used. This is because it is intended to lower the carrier injection efficiency with respect to the upper insulating film ($Al_2O_3$) 23 and suppress the reverse current by using the electrodes having the large work function.

As described above, it is preferable to set the work function of the upper electrode 30 of the diode element greater than the work function of the lower electrode (bit line electrode) 10. However, it is not absolutely required to configure the upper and lower electrodes of the diode element by use of the same material because of the process and cost.

Next, the forming method of the main portion of the diode structure of the present embodiment is simply explained. The lower insulating film 21 can be formed by forming a chemical oxide film on an Si substrate surface. Further, Si fine grains are formed by depositing amorphous Si and then annealing the same. It is necessary to pay attention to the fact that the grain diameter of the Si fine grain is largely dependent on the film thickness of the amorphous Si film deposited before annealing. Further, the $Al_2O_3$ film used as the upper insulating film 23 on the Si fine grains can be formed by use of a method such as atomic layer deposition (ALD) using TMA (Al $(CH_3)_3$) and $O_3$ or $H_2O$.

Thus, according to this embodiment, the diode element of the ReRAM cell array is formed with the MIM structure obtained by laminating the lower insulating film 21, conductive fine grain layer 22 and upper insulating film 23, the film thickness of the upper insulating film 23 is set greater than the film thickness of the lower insulating film 21 and the dielectric constant of the upper insulating film 23 is set greater than the dielectric constant of the lower insulating film 21. As a result, a diode excellent in rectification characteristic can be realized while the height in the film thickness direction is suppressed. Therefore, the miniaturization and characteristic enhancement of the ReRAM cell array can be achieved.

Second Embodiment

Figure 12:
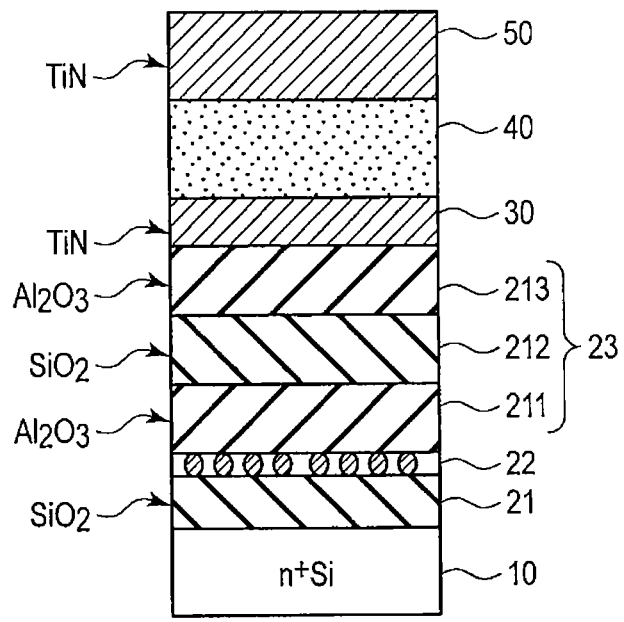
FIG. 12 is a cross-sectional view showing the configuration of a memory cell portion used in a nonvolatile semiconductor memory device according to a second embodiment.

FIG. 12 is a cross-sectional view showing the configuration of a memory cell portion used in a nonvolatile semiconductor memory device according to a second embodiment.

Like the first embodiment, an $SiO_2$ film used as a lower insulating film 21 is formed on a lower electrode ($n^+$-type Si layer) 10 configuring a portion of a word line and a fine grain layer 22 containing Si fine grains is formed thereon. Unlike the first embodiment, a laminated film formed of an $Al_2O_3$ film 211 with a film thickness of 5 nm, an $SiO_2$ film 212 with a film thickness of 5 nm and an $Al_2O_3$ film 213 with a film thickness of 5 nm is provided as an upper insulating film 23 on the fine grain layer 22. Like the first embodiment, a TiN film 30 used as a conductive electrode, a variable-resistance film 40 and a TiN film used as an upper electrode 50 configuring a portion of a bit line are formed on the upper insulating film 23.

The second embodiment has a feature that the upper insulating film 23 in the first embodiment is replaced with the laminated film. The advantage obtained by replacing the upper insulating film 23 with the laminated film is to realize the performance of the current characteristic that cannot be realized in the single-layer film. For example, when the $Al_2O_3/SiO_2/Al_2O_3$ structure is used as the laminated film, a feature that both of the low electric field leakage current and high electric field leakage current can be suppressed in comparison with a case of the $Al_2O_3$ single-layer film can be obtained.

The operation of suppressing the high electric field leakage current means that the reverse current is suppressed in the diode operation. The effect that the scattering probability of carriers (electrons) that pass can be increased by using the laminated film and the reliability of the diode is enhanced can be attained. This is because the interface of each insulating film configuring the laminated film functions as a scattering body and it is expected to reduce the electron energy.

The low electric field leakage current may mainly result from dielectric relaxation (slow polarization) of a high dielectric strength material insulating film. That is, the capacitance of the high dielectric strength material insulating film is changed with time due to slow polarization after voltage application, and as a result, a current flows in the exterior of the memory cell. Since the capacitance change extends over a time domain of many digits, this results in non-uniformity of the potential of an interconnection layer in the ReRAM cell array. However, if the $Al_2O_3/SiO_2/Al_2O_3$ laminated film is used instead of the $Al_2O_3$ single-layer film, the film thickness (volume) of the $Al_2O_3$ film becomes small. As a result, the slow polarization of the high dielectric strength material insulating film can be suppressed. Therefore, if a laminated film of the high dielectric strength material insulating film and a normal insulating film ($SiO_2$, SiON or the like) is used, the effect that the non-uniformity of the ReRAM cell array caused by the dielectric relaxation (slow polarization) is alleviated can be attained.

Figure 13:
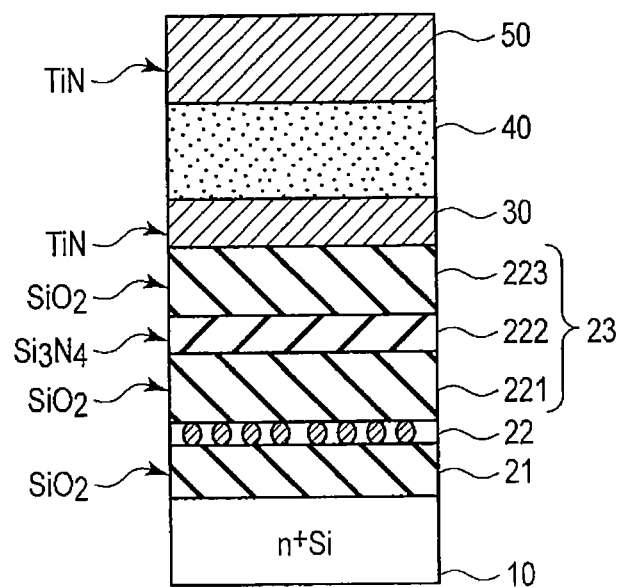
FIG. 13 is a cross-sectional view showing the configuration of a memory cell portion according to a modification of the second embodiment.

As another example of forming the upper insulating film 23 into the laminated structure, as shown in FIG. 13, the structure of the upper insulating film 23 may be formed with an $SiO_2/Si_3N_4/SiO_2$ laminated film (ONO film). That is, an ONO laminated film formed of an $SiO_2$ film 221 with a film thickness of 5 nm, an $Si_3N_4$ film 222 with a film thickness of 3 nm and an $SiO_2$ film 223 with a film thickness of 5 nm is provided on the fine grain layer 22.

For example, the ONO laminated film has achieved good results as an inter-polyinsulating film of a floating gate flash memory cell and can suppress a leakage current in comparison with a case where a single-layer $SiO_2$ film is used as the upper insulating film 23. Further, in this modification, a high dielectric strength material insulating film including a metal oxide film is not used, a leakage current or capacitance variation caused by the slow polarization will not occur. Therefore, a highly uniform stable ReRAM cell array can be formed.

Figure 14:
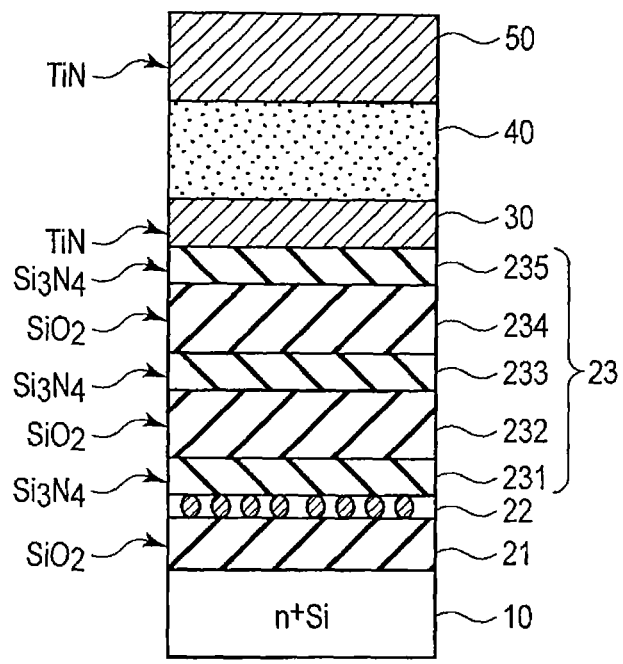
FIG. 14 is a cross-sectional view showing the configuration of a memory cell portion according to another modification of the second embodiment.

As still another example of forming the upper insulating film 23 into the laminated structure, as shown in FIG. 14, the structure may be formed with an $Si_3N_4/SiO_2/Si_3N_4/SiO_2/Si_3N_4$ laminated film (NONON film). That is, a laminated film (NONON film) formed of a silicon nitride film 231 of 3 nm, a silicon oxide film 232 of 5 nm, a silicon nitride film 233 of 3 nm, a silicon oxide film 234 of 5 nm and a silicon nitride film 235 of 3 nm is arranged on the fine grain layer 22.

For example, it is known that the NONON laminated film is used as an inter-poly insulating film of a floating gate flash memory cell and can suppress a leakage current in comparison with a case of a single-layer $SiO_2$ film used as the upper insulating film. Further, the leakage current can be reduced in comparison with a case of the ONO laminated film shown in FIG. 13. The reason is based on the same principle as that in the case of the AOA film presented before. That is, the carrier injection amount from the electrode can be reduced if a material with a high dielectric constant is disposed in contact with the electrode.

Further, in this modification, since the high dielectric strength material insulating film including the metal oxide film is not used, a leakage current or capacitance variation caused by the slow polarization does not occur like the case of the ONO film. Therefore, a highly uniform stable ReRAM cell array can be formed if this modification is used.

Third Embodiment

Figure 15:
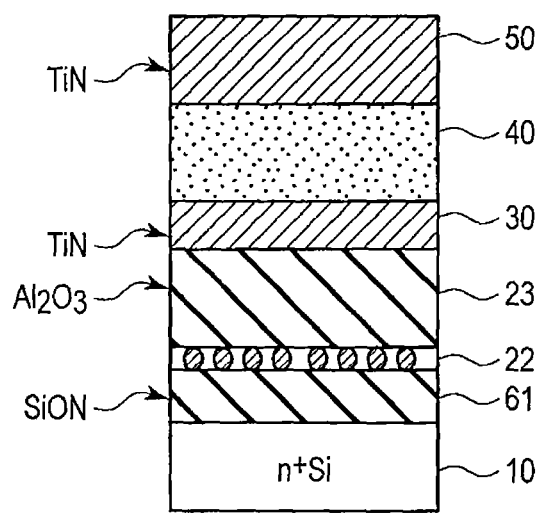
FIG. 15 is a cross-sectional view showing the configuration of a memory cell portion used in a nonvolatile semiconductor memory device according to a third embodiment.

FIG. 15 is a cross-sectional view showing the configuration of a memory cell portion used in a nonvolatile semiconductor memory device according to a third embodiment.

A silicon oxynitride film 61 with a film thickness of 0.7 nm is arranged as a lower insulating film on a lower electrode ($n^+$-type Si layer) 10 configuring a portion of a word line. Like the first embodiment, a fine grain layer 22, an upper insulating film 23 formed of $Al_2O_3$, a TiN film used as a conductive electrode 30, a variable-resistance film 40 and a TiN film used as an electrode 50 configuring a portion of a bit line are laminated thereon.

The third embodiment has a feature that the lower insulating film in the first embodiment is changed from the silicon oxide film 21 to the silicon oxynitride film 61. The advantage obtained by changing the lower insulating film to the silicon oxynitride film 61 is to enhance the reliability. Introduction of nitrogen has an effect of preventing deterioration in the $Si/SiO_2$ interface characteristic and an effect of enhancing the durability of a diode.

Almost the same explanation as that in the first embodiment can be applied to the film thickness of $Al_2O_3$ of the upper insulating film 23. Therefore, the desirable range of the film thickness of $Al_2O_3$ as the upper insulating film 23 is set to 5 nm or more and less than 18 nm.

In the third embodiment, the upper insulating film 23 is formed of $Al_2O_3$, but the upper insulating film 23 is not necessarily formed of $Al_2O_3$. As is pointed out in the first embodiment, various materials such as an oxide, oxynitride, aluminate, silicate or aluminium silicate of a metal such as Hf, Zr, La, Ce, X, Ti or the like can be used. As indicated in the second embodiment and the modification thereof, various laminated films such as an AOA film, ONO film, and NONON film may be used as the upper insulating film 23. However, when a laminated film is formed of at least two types of the silicon oxide film, silicon oxynitride film and silicon nitride film, it is necessary to set the mean nitrogen concentration in the film thickness direction of the upper insulating film 23 higher than the mean nitrogen concentration in the film thickness direction of the lower insulating film 61 in order to set the dielectric constant of the upper insulating film 23 higher than that of the lower insulating film 61.

Figure 16:
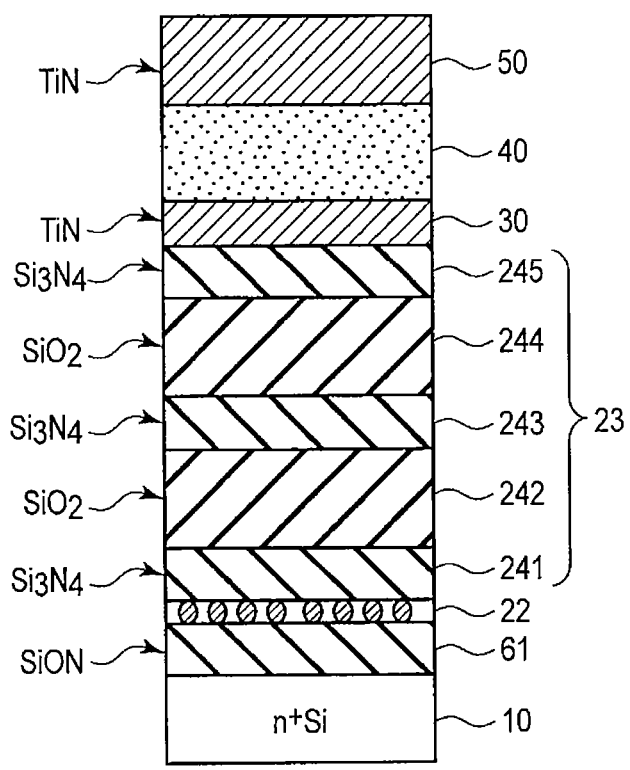
FIG. 16 is a cross-sectional view showing the configuration of a memory cell portion according to a modification of the third embodiment.

FIG. 16 shows an example in which a NONON film is used as the upper insulating film 23. The upper insulating film 23 is formed by sequentially laminating an $Si_3N_4$ film 241 with a film thickness of 3 nm, an $SiO_2$ film 242 with a film thickness of 5 nm, an $Si_3N_4$ film 243 with a film thickness of 3 nm, an $SiO_2$ film 244 with a film thickness of 5 nm and an $Si_3N_4$ film 245 with a film thickness of 3 nm from the fine grain layer 22 side.

In this case, it is supposed that the mean film composition of the lower insulating film 61 formed of SiON has x=0.8 in $(SiO_2)_x(Si_3N_4)_{1-x}$, for example. It is desirable to set $0.75<x\leq 1$ to suppress defect formation. The lower insulating film 61 can be formed by NO oxynitride formation, plasma nitriding or the combination thereof.

The total film thickness of $SiO_2$ is 10 nm and the total film thickness of $Si_3N_4$ is 9 nm based on the film thickness configuration of the upper insulating film 23. Therefore, the equivalent "mean film composition" is expressed as follows in $(SiO_2)_x(Si_3N_4)_{1-x}$.

$$X=10/(10+9)=0.53$$

Since the mean nitrogen concentration is given based on the ratio of N atoms of $4(1-x)/(7-4x)\times 100(\%)$ in the total number of atoms, the mean nitrogen concentration of the lower insulating film 61 becomes 21% and the mean nitrogen concentration of the upper insulating film 23 becomes 39%. That is, the mean nitrogen concentration in the film thickness direction of the upper insulating film 23 becomes higher than the mean nitrogen concentration in the film thickness direction of the lower insulating film 61 and the dielectric constant of the upper insulating film 23 becomes higher than that of the lower insulating film 61.

Fourth Embodiment

Figure 17:
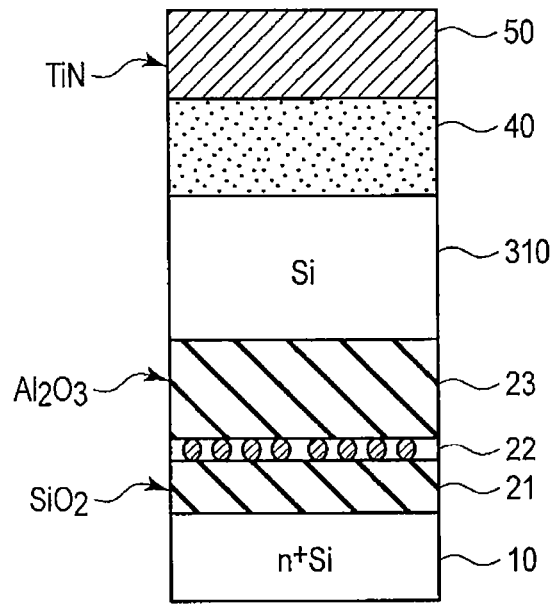
FIG. 17 is a cross-sectional view showing the configuration of a memory cell portion used in a nonvolatile semiconductor memory device according to a fourth embodiment.

FIG. 17 is a cross-sectional view showing the configuration of a memory cell portion used in a nonvolatile semiconductor memory device according to a fourth embodiment.

Like the first embodiment, a silicon oxide film as a lower insulating film 21, a fine grain layer 22 and an $Al_2O_3$ film 23 as an upper insulating film 23 are provided on a lower electrode ($n^+$-type Si layer) 10 configuring a portion of a word line. Unlike the first embodiment, an Si film 310 with a thickness of 20 nm is provided as a conductive electrode on the upper insulating film 23. Like the first embodiment, a variable-resistance film 40 and a TiN film as an upper electrode 50 are laminated on the Si film 310. In this case, dopant impurities are not doped in the Si film 310.

The fourth embodiment has a feature that the intermediate conductive electrode TiN film 30 in the first embodiment is replaced with the Si film 310. The advantage obtained by replacing the intermediate conductive electrode with the Si film 310 is to enhance the withstand voltage in the reverse direction. That is, a diode with a high reverse withstand voltage is obtained while the reverse current is suppressed by utilizing this embodiment.

The variable-resistance film 40 is arranged on the Si film 310 as the intermediate conductive electrode in this embodiment, but a thin metal layer (such as TiN) may be disposed between the Si film 310 and the variable-resistance film 40. Further, in this embodiment, the upper insulating film 23 is not necessarily formed of $Al_2O_3$ and the same modification as that of the first embodiment can be made. Additionally, dopant impurities may be doped in the Si film 310 in the range of $10^{17}$ cm$^{-3}$ or less, for example, if the deterioration in the reverse withstand voltage does not become a problem.

Fifth Embodiment

Figure 18:
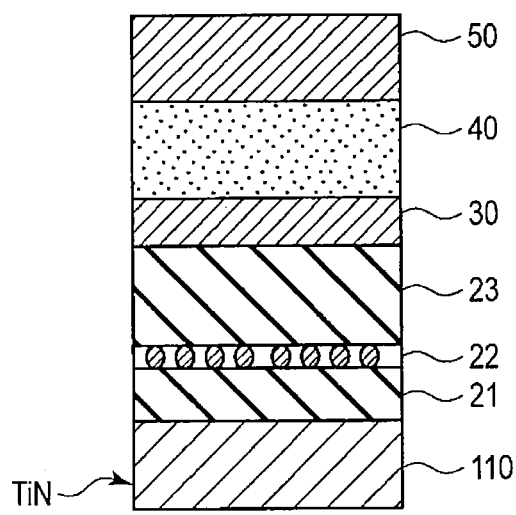
FIG. 18 is a cross-sectional view showing the configuration of a memory cell portion used in a nonvolatile semiconductor memory device according to a fifth embodiment.

FIG. 18 is a cross-sectional view showing the configuration of a memory cell portion used in a nonvolatile semiconductor memory device according to a fifth embodiment.

As a lower electrode 110 that forms a portion of a word line, a TiN layer is used instead of Si. Like the first embodiment, a silicon oxide film 21 as a lower insulating film 21, a fine grain layer 22 and an $Al_2O_3$ film as an upper insulating film 23 are formed on the TiN layer 110. Further, a TiN film as a conductive electrode 30, a variable-resistance film 40 and a TiN film as an upper electrode 50 are laminated thereon.

The fifth embodiment has a feature that the lower conductive electrode in the first embodiment is changed from the $n^+$-type Si film 10 to the TiN film 110. The advantage obtained when a metal electrode (including a conductive material such as a metal nitride) is used as the lower electrode is that a memory is not necessarily formed on the Si substrate and a three-dimensional stereoscopic structure can be easily formed.

(Modification)

This invention is not limited to the above embodiments. In the embodiments, the example in which the Si fine crystals are used as the conductive fine grains, but the conductive fine grains are not always limited to Si. A semiconductor such as Ge, GaN, a semiconductor material such as silicon germanium, silicon carbide and the like may be used in addition to Si. Further, something obtained by adding dopant impurities in the above materials can be used. Additionally, the conductive fine grains are not necessarily limited to a semiconductor and a metal, metal nitride, metal carbide, metal silicate and the like having the conductivity can be widely used.

Further, it is not always necessary for the lower insulating film to have the uniform composition in the film thickness direction, and if the composition control can be performed at the atomic layer level, a laminated structure of silicon oxide film/silicon nitride film/silicon oxide film may be used as the lower insulating film. Further, a semiconductor substrate itself may be used or something obtained by forming an inter-level insulating film on the semiconductor substrate may be used as an underlying substrate used for forming memory cell portions and respective interconnection layers. Furthermore, a substrate with an insulating property can also be used.

Further, the lower electrode is not necessarily formed of $n^+$-type silicon and a metal, metal nitride, metal carbide, metal silicate and the like having the conductivity can be widely used. For example, tungsten or titanium nitride (TiN) or the like may be used as the lower electrode. In addition, like the lower electrode, various materials selected from a metal, semiconductor can be used as the upper electrode.

Further, the consideration in the first embodiment can be not only used for a memory cell array with the single-layer cross-point structure but also applied to a memory cell with the three-dimensional structure obtained by laminating the memory cell arrays.

FIG. 19 shows an example in which a first interconnection layer 100, memory cell portion 3, second interconnection layer 500, memory cell portion 3 and first interconnection layer 100 are dealt with as one unit and a three-dimensional structure is configured by laminating the units. As shown in FIG. 20, the memory cell portions 3 each configured by a diode element 20 and variable-resistance element 40 have a symmetrical structure in the vertical direction with the bit line 500 disposed therebetween. Although not shown in the drawing, an inter-level insulating film is provided between the lowermost first interconnection layer 100 and the substrate 1.

With the above configuration, the number of cells commonly provided for one interconnection increases and it becomes necessary to take a countermeasure against the deterioration of the performance, disturbance or the like of a non-selected cell and degradation in the reliability. However, since the layer number is reduced and the cost merit can be attained, it can be suitably applied as a file memory.

FIG. 21 shows an example in which the laminated structure of a first interconnection layer 100, memory cell portion 3 and second interconnection layer 500 is formed in a two-layer form. The lower laminated structure and the upper laminated structure are electrically isolated. With this structure, the number of interconnection layers increases and the cost rises. However, since the number of cells belonging to one interconnection becomes half that of FIG. 19, it is suitable for high-speed operation and is excellent in reliability.

Thus, as the way of laminating the interconnection layers when the three-dimensional structure is formed, various cases may be considered in addition to the above two examples. Any one of the three-dimensional structures can be basically applied to the diode of this embodiment.

Furthermore, this embodiment is an invention related to the element technique for a diode of a memory cell and is not dependent on the way of connection at the circuit level of the memory cell. Therefore, it is not only limited to a case where the technique of the embodiment is applied to the memory cell array with the cross-point structure and it can be applied to another cell array structure.

Furthermore, it is not necessarily limited to a case where the diode structure of this embodiment is applied to a unipolar variable-resistance element. For example, even a bipolar variable-resistance element can be used by using a method of serially connecting the two diodes of this embodiment with the polarities set in the reverse direction and using the same. That is, this embodiment relates to the diode structure and does not restrict the way of connecting the diodes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a plurality of first interconnections arranged parallel to one another,
   a plurality of second interconnections arranged parallel to one another and provided separately from the first interconnections, the plurality of second interconnections intersecting the first interconnections, and
   memory cell portions respectively arranged at intersecting portions between the first interconnections and the second interconnections, each of the memory cell portions including a variable-resistance element that stores a state of different resistance as information and a diode element having a rectifying characteristic, the variable-resistance element and the diode element being laminated between the first and second interconnections,
   wherein the diode element has a laminated structure including a first insulating film, a conductive fine grain layer containing conductive fine grains and a second insulating film sequentially arranged from the side of the first interconnections, physical film thickness of the second insulating film is greater than physical film thickness of the first insulating film and a dielectric constant of the second insulating film is greater than a dielectric constant of the first insulating film.

2. The device according to claim 1, wherein the first insulating film is in contact with one of the first interconnections, and the second insulating film is either in direct contact with the variable-resistance element or connected to the variable-resistance element via a conductive electrode.

3. The device according to claim 1, wherein the first insulating film is a silicon oxide film and physical film thickness of the silicon oxide film is in a range of not less than 0.3 nm and not greater than 0.9 nm.

4. The device according to claim 1, wherein the first insulating film is a silicon oxynitride film and a lower limit of the silicon oxynitride film is 0.3 nm in physical film thickness and an upper limit is 0.9 nm in electrical film thickness.

5. The device according to claim 1, wherein the conductive fine grain layer includes silicon fine grains and a diameter of the silicon fine grain in a film thickness direction of the conductive fine grain layer is in a range of not less than 0.7 nm and not greater than 3.0 nm.

6. The device according to claim 1, wherein the second insulating film includes an alumina film or a laminated film of alumina and a silicon oxide film.

7. The device according to claim 1, wherein the second insulating film includes one of a silicon oxynitride film and silicon nitride film or includes a laminated film of a silicon oxide film, silicon nitride film and silicon oxide film.

8. The device according to claim 1, wherein the first insulating film includes a silicon oxide film or silicon oxynitride film, the second insulating film includes one of a silicon oxynitride film and silicon nitride film or includes a laminated film of at least two of a silicon oxide film, silicon oxynitride film and silicon nitride film, and a mean nitrogen concentration in a film thickness direction of the second insulating film is higher than a mean nitrogen concentration in a film thickness direction of the first insulating film.

9. The device according to claim 1, wherein the first insulating film is in contact with one of the first interconnections, and the second insulating film is connected to the variable-resistance element via a silicon layer.

10. The device according to claim 1, wherein the second insulating film includes one of an oxide, oxynitride, aluminate, silicate and aluminium silicate of at least one of Hf, Zr, La, and Ce or includes a laminated film thereof.

11. The device according to claim 1, wherein the first interconnection includes TiN.

12. The device according to claim 1, wherein a work function of a material that forms the second interconnection is greater than a work function of a material that forms the first interconnection.

13. The device according to claim 1, wherein a material that forms the second interconnection is the same as a material that forms the first interconnection.

14. A nonvolatile semiconductor memory device comprising:
a plurality of first interconnections arranged parallel to one another,
a plurality of second interconnections arranged parallel to one another and provided separately from the first interconnection layer, the plurality of second interconnections intersecting the first interconnections,
a plurality of third interconnections arranged parallel to one another and provided separately from the first and second interconnections, the plurality of third interconnections intersecting the second interconnections, and
memory cell portions respectively arranged at intersecting portions between the first interconnections and the second interconnections and at intersecting portions between the second interconnections and the third interconnections, each of the memory cell portions including a variable-resistance element that stores a state of different resistance as information and a diode element having a rectifying characteristic, the variable-resistance element and the diode element being laminated between the first and second interconnections and between the second and third interconnections,
wherein the diode element has a laminated structure including a first insulating film, a conductive fine grain layer containing conductive fine grains and a second insulating film sequentially arranged between the first and second interconnections and between the second and third interconnections, physical film thickness of the second insulating film is greater than physical film thickness of the first insulating film and a dielectric constant of the second insulating film is greater than a dielectric constant of the first insulating film.

15. A nonvolatile semiconductor memory device comprising:
a plurality of memory cell units laminated on or above a substrate,
each memory cell unit includes:
a plurality of first interconnections arranged parallel to one another,
a plurality of second interconnections arranged parallel to one another and provided separately from the first interconnections, the plurality of second interconnections intersecting the first interconnections, and
memory cell portions respectively arranged at intersecting portions between the first interconnections and the second interconnections, each of the memory cell portions including a variable-resistance element that stores a state of different resistance as information and a diode element having a rectifying characteristic, the variable-resistance element and the diode element being laminated between the first and second interconnections,
wherein the diode element has a laminated structure including a first insulating film, a conductive fine grain layer containing conductive fine grains and a second insulating film sequentially arranged from the side of the first interconnections, physical film thickness of the second insulating film is greater than physical film thickness of the first insulating film and a dielectric constant of the second insulating film is greater than a dielectric constant of the first insulating film.

* * * * *

UNITED STATES PATENT AND TRADEMARK OFFICE
CERTIFICATE OF CORRECTION

Page 1 of 1

| | |
|---|---|
| PATENT NO. | : 8,559,216 B2 |
| APPLICATION NO. | : 13/560557 |
| DATED | : October 15, 2013 |
| INVENTOR(S) | : Naoki Yasuda et al. |

It is certified that error appears in the above-identified patent and that said Letters Patent is hereby corrected as shown below:

On the title page, Item (73), the Assignee should read:

--(73)  Assignee:  Kabushiki Kaisha Toshiba, Tokyo (JP)--

Signed and Sealed this
Thirty-first Day of December, 2013

Margaret A. Focarino
*Commissioner for Patents of the United States Patent and Trademark Office*